(12) United States Patent
Hamaguchi et al.

(10) Patent No.: US 7,116,180 B2
(45) Date of Patent: Oct. 3, 2006

(54) VOLTAGE-CONTROLLED OSCILLATOR AND INTEGRATED CIRCUIT DEVICE PROVIDED WITH IT

(75) Inventors: Mutsumi Hamaguchi, Tenri (JP); Masafumi Yamanoue, Yamatokouriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 125 days.

(21) Appl. No.: 10/697,329

(22) Filed: Oct. 31, 2003

(65) Prior Publication Data

US 2004/0090278 A1    May 13, 2004

(30) Foreign Application Priority Data

Nov. 1, 2002    (JP) .............................. 2002-319963

(51) Int. Cl.
*H03B 1/00*    (2006.01)
(52) U.S. Cl. .................... 331/74; 331/175; 331/46; 331/2; 331/49
(58) Field of Classification Search ................ 331/49, 331/46, 48, 179, 2, 74, 175
See application file for complete search history.

(56) References Cited

U.S. PATENT DOCUMENTS 5,757,857 A   5/1998  Buchwald
5,994,972 A * 11/1999  Katsui .................... 331/113 R
6,661,297 B1* 12/2003  Pepper ........................ 331/49
2002/0075086 A1* 6/2002  Pepper ........................ 331/49

FOREIGN PATENT DOCUMENTS

| EP | 01 126 427 A2 | 11/1984 |
|----|---------------|---------|
| JP | 58-136142 A   | 8/1983  |
| JP | 60-185412     | 9/1985  |
| JP | 08-079069     | 3/1996  |
| JP | 08-149000     | 6/1996  |
| JP | 08-242133     | 9/1996  |
| JP | 11-177341     | 7/1999  |
| JP | 11-298242     | 10/1999 |
| JP | 2000-036701   | 2/2000  |
| JP | 2001-127544   | 5/2001  |
| JP | 2001-217652   | 8/2001  |
| JP | 2001-276737   | 10/2001 |
| JP | 2002-190709   | 7/2002  |
| JP | 2005-522927   | 10/2003 |
| JP | 2003-318731   | 11/2003 |

* cited by examiner

*Primary Examiner*—Arnold Kinkead
(74) *Attorney, Agent, or Firm*—Birch, Stewart, Kolasch & Birch, LLP

(57) ABSTRACT

A voltage-controlled oscillator has a voltage-controlled oscillation circuit that oscillates at a frequency according to a control voltage and a limiter circuit that limits the output of the voltage-controlled oscillator to a predetermined level. This configuration makes it possible to maintain a constant output level irrespective of the oscillation frequency.

16 Claims, 6 Drawing Sheets

VOLTAGE-CONTROLLED OSCILLATOR AND INTEGRATED CIRCUIT DEVICE PROVIDED WITH IT

This nonprovisional application claims priority under 35 U.S.C. § 119(a) on patent application Ser. No. 2002-319963 filed in JAPAN on Nov. 1, 2002, the entire contents of which are hereby incorporated by reference.

BACKGROUND OF THE INVENTION

1. Field of the Invention

The present invention relates to a voltage-controlled oscillator that oscillates at a frequency according to a control voltage, and relates also to an integrated circuit device provided with such a voltage-controlled oscillator.

2. Description of the Prior Art

Satellite broadcast tuners, cable television tuners, and the like incorporate a PLL (phase-locked loop) synthesizer circuit as a means for controlling the frequency of the local signal, and its oscillation source is typically realized with a voltage-controlled oscillator that oscillates at a frequency according to a control voltage. In a case where the frequency of the local signal needs to be varied over a wide range, the oscillation source of a PLL synthesizer circuit is realized with a voltage-controlled oscillator having a plurality of voltage-controlled oscillation circuits switchably connected in parallel with one another, each voltage-controlled oscillation circuit oscillating in a different frequency range (see Japanese Patent Application Laid-Open No. S58-136142).

It is true that, with the voltage-controlled oscillator disclosed in the patent publication mentioned above, it is possible to vary the frequency of the local signal over a wide range without unnecessarily widening the variable oscillation frequency range of each voltage-controlled oscillation circuit. This helps minimize lowering of the Q value of the resonance circuit that is included in each voltage-controlled oscillation circuit, and thus helps achieve satisfactory phase noise characteristics.

However, the voltage-controlled oscillator configured as described above has the disadvantage that the output levels of the individual voltage-controlled oscillation circuits differ from one another, causing the output level of the local signal to vary according to the frequency. This may pose a problem in a case where the succeeding-stage circuit requires the local signal to be fed thereto at a constant level over the entire frequency range. Even in a voltage-controlled oscillator having only one voltage-controlled oscillation circuit, the output level of the local signal may vary according to the control voltage fed thereto. This may pose a similar problem as described above.

Moreover, in the voltage-controlled oscillator configured as described above, the variable oscillation frequency ranges of adjacent voltage-controlled oscillation circuits are so set as to overlap at their ends to achieve oscillation over a continuous frequency range as a whole. However, no complete study has ever been made of the fact that the variable oscillation frequency ranges of the individual voltage-controlled oscillation circuits vary owing to various factors (such as variation in the supply voltage, variation in the operating temperature, and fabrication variations). As a result, in a case where the voltage-controlled oscillator configured as described above is incorporated in an integrated circuit device, it may be impossible to uniquely decide which voltage-controlled oscillation circuit to select for oscillation at a given frequency.

Now, the problem mentioned above will be explained in more detail with reference to FIG. 7. FIG. 7 is a diagram showing the variable oscillation frequency range of a conventional voltage-controlled oscillator. In the voltage-controlled oscillator shown in this figure, the variable oscillation frequency ranges of its constituent voltage-controlled oscillation circuits VCO1 and VCO2 are, when most deviated on the low side (in a low state), from 90 MHz to 140 MHz and from 130 MHz to 180 MHz, respectively, and, when most deviated on the high side (in a high state), from 110 MHz to 160 MHz and from 150 MHz to 200 MHz, respectively. In this way, in this conventional voltage-controlled oscillator, the variable oscillation frequency ranges of the voltage-controlled oscillation circuits VCO1 and VCO2 are so set as to overlap at their ends in each state to achieve oscillation over a continuous frequency range as a whole.

It is true that, with the voltage-controlled oscillator configured as described above, it is possible to control the oscillation frequency in the range from 110 MHz to 180 MHz in any state. However, when the voltage-controlled oscillation circuits VCO1 and VCO2 are considered individually, their variable oscillation frequency ranges free from the influence of variations are limited to from 110 MHz to 140 MHz and from 150 MHz to 180 MHz, respectively. Thus, for oscillation in the frequency range from 140 MHz to 150 MHz, which to choose between the voltage-controlled oscillation circuits VCO1 and VCO2 cannot be uniquely decided. As a result, the voltage-controlled oscillator configured as described above requires a circuit for checking whether or not each of the voltage-controlled oscillation circuits VCO1 and VCO2 can oscillate at a desired frequency and a circuit for choosing, when one of them is found to be unable to oscillate at that frequency, the other. This increases the circuit scale of and the power consumption by the voltage-controlled oscillator.

SUMMARY OF THE INVENTION

It is a first object of the present invention to provide a voltage-controlled oscillator that can maintain a constant output level all the time irrespective of the oscillation frequency and to provide an integrated circuit device provided with such a voltage-controlled oscillator. It is a second object of the present invention to provide a voltage-controlled oscillator that can uniquely decide which voltage-controlled oscillation circuit to select for oscillation at a given frequency and to provide an integrated circuit device provided with such a voltage-controlled oscillator.

To achieve the first object above, according to one aspect of the present invention, a voltage-controlled oscillator is provided with: a voltage-controlled oscillation circuit that oscillates at a frequency according to a control voltage, and a limiter circuit that limits the output of the voltage-controlled oscillator to a predetermined level. Alternatively, according to another aspect of the present invention, a voltage-controlled oscillator is provided with: a plurality of voltage-controlled oscillation circuits that oscillate at a frequency according to a control voltage; a selector circuit that selects one of the voltage-controlled oscillation circuits and makes the selected voltage-controlled oscillation circuit operate; and a limiter circuit that limits the output of the selected voltage-controlled oscillation circuit to a predetermined level.

To achieve the second object above, according to still another aspect of the present invention, a voltage-controlled oscillator is provided with: a plurality of voltage-controlled oscillation circuits that oscillate at a frequency according to a control voltage; and a selector circuit that selects one of the voltage-controlled oscillation circuits and makes the selected voltage-controlled oscillation circuit operate. Here, the variable oscillation frequency ranges of adjacent voltage-controlled oscillation circuits are so set as to overlap at their ends, and the variable oscillation frequency ranges of the individual voltage-controlled oscillation circuits are so adjusted that the upper end frequency of the nth (where n≧1) voltage-controlled oscillation circuit as observed when most deviated on the low side is higher than the lower end frequency of the mth (where m=n+1) voltage-controlled oscillation circuit as observed when most deviated on the high side.

According to a further aspect of the present invention, an integrated circuit device is provided with a voltage-controlled oscillator configured as described above.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1A:
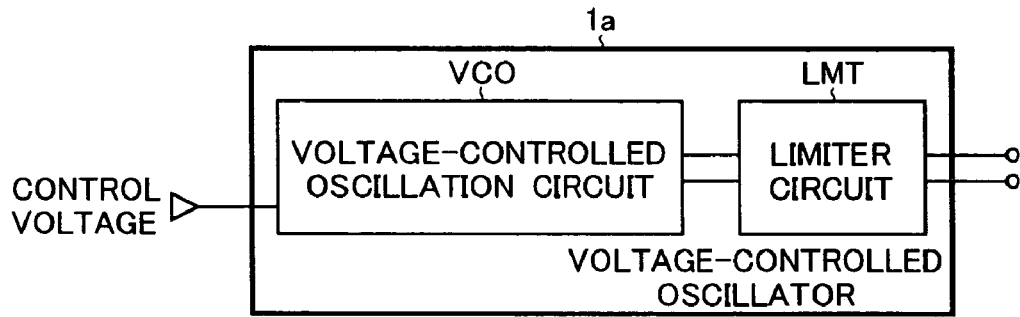
FIGS. 1A and 1B are block diagrams of voltage-controlled oscillators embodying the present invention.
Figure 1B:
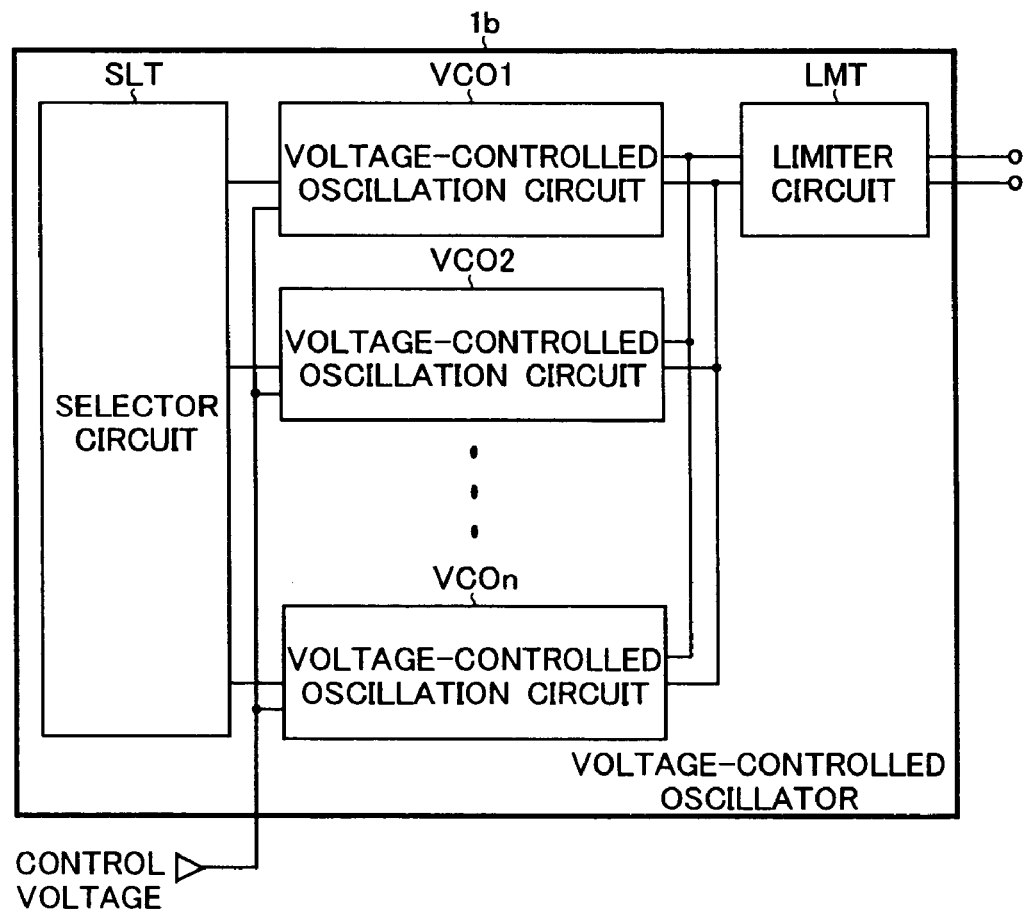

FIGS. 1A and 1B are block diagrams of voltage-controlled oscillators embodying the present invention. As shown in FIG. 1A, a voltage-controlled oscillator 1a embodying the invention is composed of a voltage-controlled oscillation circuit VCO that oscillates at a frequency according to a control voltage and a limiter circuit LMT that limits the output of the voltage-controlled oscillation circuit VCO to a predetermined level. In the voltage-controlled oscillator 1a configured in this way, even when the output level of the voltage-controlled oscillation circuit VCO varies as the oscillation frequency thereof varies according to the control voltage, so long as the output level remains higher than a predetermined level, the output level of the limiter circuit LMT remains constant. With this configuration, it is possible to maintain a constant output level all the time irrespective of the oscillation frequency.

In a case where the oscillation frequency needs to be varied over a wide range, as shown in FIG. 1B, a voltage-controlled oscillator 1b embodying the invention may be composed of a plurality of voltage-controlled oscillation circuits VCO1 to VCOn that oscillate at a frequency according to a control voltage, a selector circuit SLT that selects one of the voltage-controlled oscillation circuits VCO1 to VCOn to make it operate, and a limiter circuit LMT that limits the output of the selected voltage-controlled oscillation circuit to a predetermined level. In the voltage-controlled oscillator 1b configured in this way, even when the output levels of the voltage-controlled oscillation circuits VCO1 to VCOn differ from one another, so long as all the output levels remain higher than a predetermined level, the output level of the limiter circuit LMT remains constant. With this configuration, it is possible to maintain a constant output level all the time irrespective of the oscillation frequency.

Figure 2:
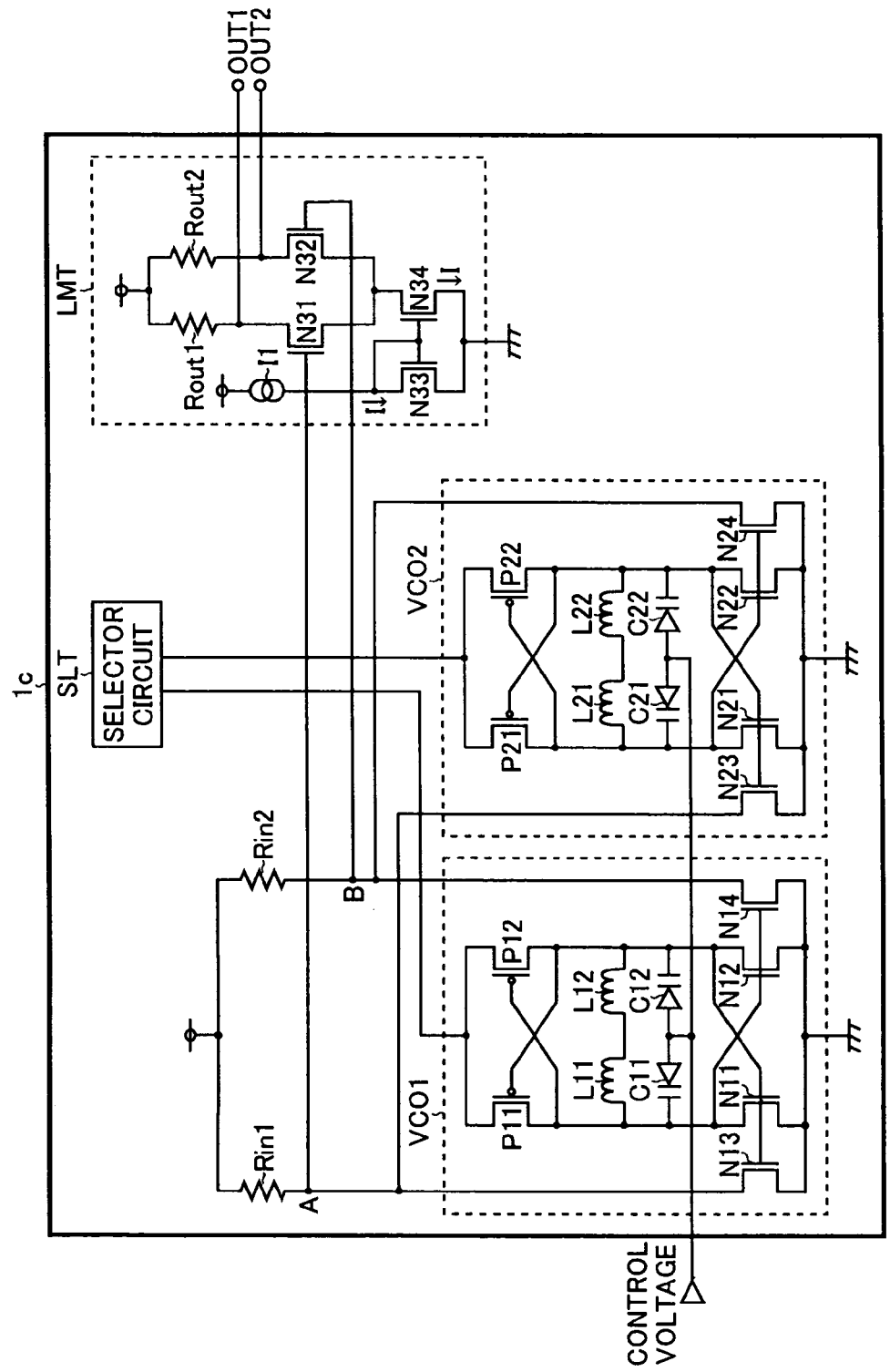
FIG. 2 is a circuit diagram of the voltage-controlled oscillator of a first embodiment of the invention.

Now, a practical example of the circuit configuration and operation of a voltage-controlled oscillator configured as described above will be described in more detail with reference to FIG. 2. FIG. 2 is a circuit diagram of the voltage-controlled oscillator of a first embodiment of the invention. As shown in this figure, the voltage-controlled oscillator 1c of this embodiment is composed of two voltage-controlled oscillation circuits VCO1 and VCO2 of which the oscillation frequency is variable in different ranges, a selector circuit SLT that selects one of the voltage-controlled oscillation circuits VCO1 and VCO2 to make it operate, and a limiter circuit LMT that limits the output of the selected voltage-controlled oscillation circuit to a predetermined level.

The voltage-controlled oscillation circuit VCO1 is composed of PMOS transistors P11 and P12, NMOS transistors N11 to N14, inductors L11 and L12, and, variable-capacitance diodes C11 and C12. Likewise, the voltage-controlled oscillation circuit VCO2 is composed of PMOS transistors P21 and P22, NMOS transistors N21 to N24, inductors L21 and L22, and variable-capacitance diodes C21 and C22. The limiter circuit LMT is composed of NMOS transistors N31 to N34, load resistors Rout1 and Rout2, and a constant current source I1.

The sources of the transistors P11 and P12 are connected together, and the node at which they are connected together is connected to one output terminal of the selector circuit SLT. The drain of the transistor P11 is connected to the gate of the transistor P12, to one end of the inductor L11, to the cathode of the variable-capacitance diode C11, to the drain of the transistor N11, and to the gates of the transistors N12 and N14. The drain of the transistor P12 is connected to the gate of the transistor P11, to one end of the inductor L12, to the cathode of the variable-capacitance diode C12, to the drain of the transistor N12, and to the gates of the transistors N11 and N13. The other ends of the inductors L11 and L12 are connected together. The anodes of the variable-capacitance diodes C11 and C12 are connected together, and the node at which they are connected together is connected to the line of the control voltage. The sources of the transistors N11 to N14 are connected together, and the node at which they are connected together is grounded.

The sources of the transistors P21 and P22 are connected together, and the node at which they are connected together is connected to the other output terminal of the selector circuit SLT. The drain of the transistor P21 is connected to the gate of the transistor P22, to one end of the inductor L21, to the cathode of the variable-capacitance diode C21, to the drain of the transistor N21, and to the gates of the transistors N22 and N24. The drain of the transistor P22 is connected to the gate of the transistor P21, to one end of the inductor L22, to the cathode of the variable-capacitance diode C22, to the drain of the transistor N22, and to the gates of the transistors N21 and N23. The other ends of the inductors L21 and L22 are connected together. The anodes of the variable-capacitance diodes C21 and C22 are connected together, and the node at which they are connected together is connected to the line of the control voltage. The sources of the transistors N21 to N24 are connected together, and the node at which they are connected together is grounded.

The drains of the transistors N13 and N23 are connected together, and the node at which they are connected together is connected through a voltage conversion resistor Rin1 to the supply power line. The drains of the transistors N14 and N24 are connected together, and the node at which they are connected together is connected through a voltage conversion resistor Rin2 to the supply power line.

One ends of the voltage conversion resistors Rin1 and Rin2 (i.e., terminals A and B) are respectively connected to the gates of the transistors N31 and N32, which serve as the differential input terminals of the limiter circuit LMT. The drains of the transistors N31 and N32, which serve as the differential output terminals of the limiter circuit LMT, are connected together through the load resistors Rout1 and Rout2, and the node at which they are connected together is connected to the supply power line. The sources of the transistors N31 and N32 are connected together, and the node at which they are connected together is connected to the drain of the transistor N34. The gates of the transistors N33 and N34 are connected together, and the node at which they are connected together is connected to the drain of the transistor N33. The drain of the transistor N33 is connected through the constant current source 11 to the supply power line. The sources of the transistors N33 and N34 are connected together, and the node at which they are connected together is grounded. In this embodiment, the current mirror circuit formed by the transistors N33 and N34 is given a current mirror ratio of 1:1. Needless to say, the current mirror circuit may be given any ratio other than 1:1, for example 1: a (where a is a positive integer).

In the voltage-controlled oscillator 1c configured as described above, whichever of the voltage-controlled oscillation circuits VCO1 and VCO2 is chosen by the selector circuit SLT is supplied with a supply voltage so as to be enabled to oscillate. Here, the voltage-controlled oscillation circuits VCO1 and VCO2 respectively oscillate at oscillation frequencies $f1$ and $f2$ given by formulae (1) below. In formulae (1), the variable L1 represents the inductance of the inductors L11 and L12, the variable L2 represents the inductance of the inductors L21 and L22, the variable C1 represents the capacitance of the variable-capacitance diodes C11 and C12, and the variable C2 represents the capacitance of the variable-capacitance diodes C21 and C22.

$$f_1 = \frac{1}{2\pi\sqrt{L1 \cdot C1}}, f_2 = \frac{1}{2\pi\sqrt{L2 \cdot C2}} \quad (1)$$

The variables C1 and C2 vary according to the control voltage, and this makes it possible to vary the oscillation frequencies 1 and 2 by varying the control voltage. Moreover, by appropriately adjusting the variables L1, L2, C1, and C2, it is possible to make the voltage-controlled oscillation circuits VCO1 and VCO2 capable of oscillating in different frequency ranges.

The current outputs of the voltage-controlled oscillation circuits VCO1 and VCO2 are added together, and their sum is then converted into a voltage by the voltage conversion resistors Rin1 and Rin2. In a case where the current outputs of the voltage-controlled oscillation circuits VCO1 and VCO2 are low, giving the voltage conversion resistors Rin1 and Rin2 high resistances makes it possible to obtain a higher voltage. The oscillation output thus converted into a voltage is then fed to the differential amplifier circuit that is included in the limiter circuit LMT. Here, if the input voltage is so high as to be out of the dynamic range of the differential amplifier circuit, the differential amplifier circuit operates in a saturated state, and thus yields a constant output level.

Now, the operation of the limiter circuit LMT will be described in more detail. When the differential amplifier circuit that is included in the limiter circuit LMT receives a voltage so high as to be out of its dynamic range, one of the transistors N31 and N32 turns on and the other turns off. For example, when the voltage at the terminal A is high and the voltage at the terminal B is low, the transistor N31 turns on and the transistor N32 turns off On the other hand, when the voltage at the terminal A is low and the voltage at the terminal B is high, the transistor N31 turns off and the transistor N32 turns on.

Suppose here that the supply voltage is VDD, that the resistance of the load resistors Rout1 and Rout2 of the differential amplifier circuit is Rout, and that the tail current that flows through the transistor N34 (i.e., the operation current of the differential amplifier circuit) is I. Then, the voltages obtained at output terminals OUT1 and OUT2 when the differential amplifier circuit is operating in a saturated state are respectively either VDD or VDD−(Rout× I). Accordingly, the differential output amplitude (i.e., the output level of the limiter circuit LMT) is 2×Rout×I. Thus, by appropriately setting the load resistance Rout and the tail current I of the differential amplifier circuit, it is possible to obtain a desired output level.

Figure 3:
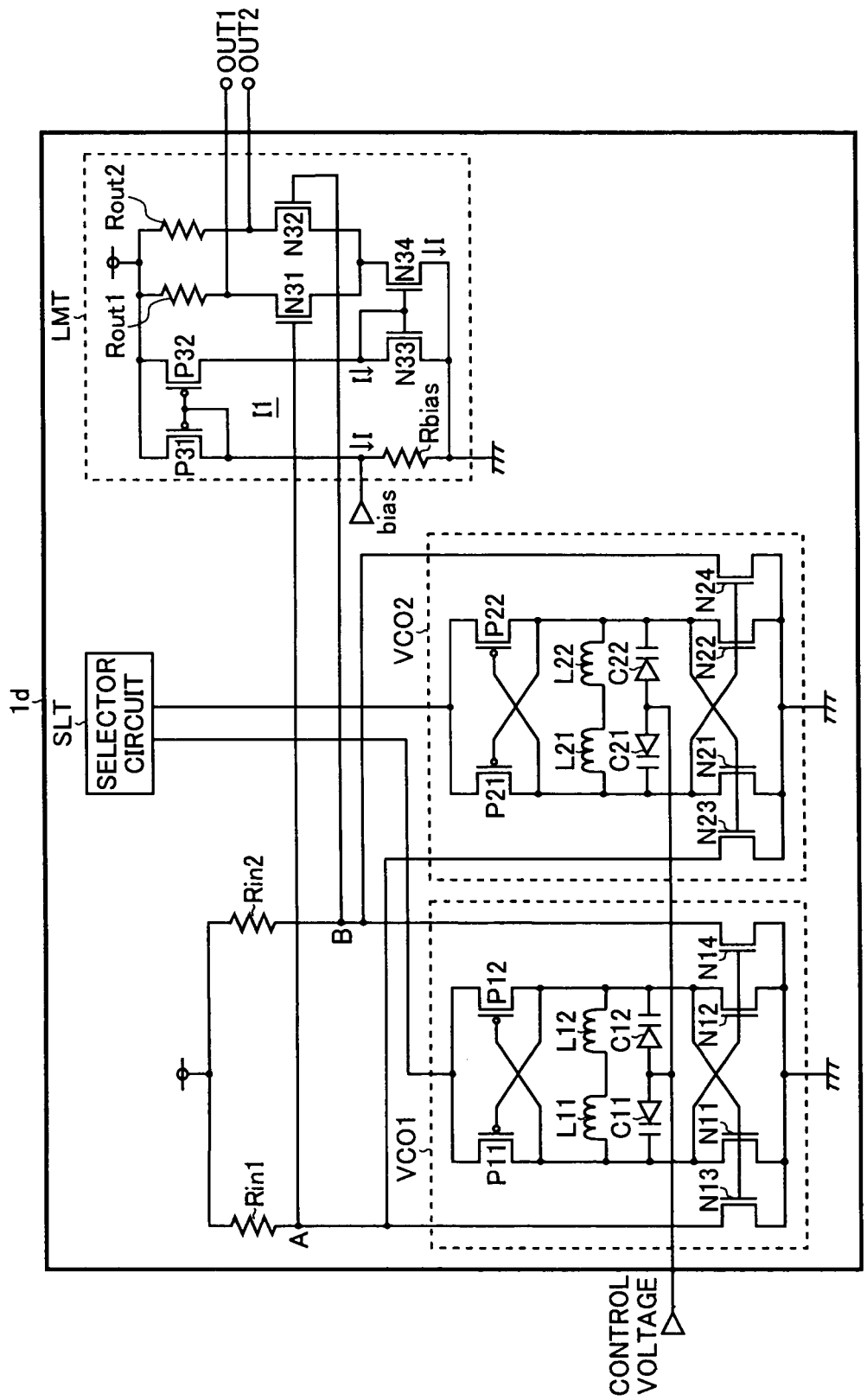
FIG. 3 is a circuit diagram of the voltage-controlled oscillator of a second embodiment of the invention.

Next, a second embodiment of the invention will be described in detail with reference to FIG. 3. FIG. 3 is a circuit diagram of the voltage-controlled oscillator of a second embodiment of the invention. The voltage-controlled oscillator 1d of this embodiment is so configured that, when formed in an integrated circuit, it suffers from minimum variation in its output level even in the presence of fabrication variations in the characteristics and constants of transistors, resistors, and other components. As shown in FIG. 3, the voltage-controlled oscillator 1d of this embodiment has largely the same configuration as that of the first embodiment (see FIG. 2). Therefore, in the following description of this embodiment, such circuit elements as are found also in the first embodiment are identified with the same reference symbols, and their explanations will not be repeated, with emphasis placed on the features unique to this embodiment (specifically, the circuit configuration of the constant current source 11 included in the limiter circuit LMT).

As shown in FIG. 3, in the voltage-controlled oscillator 1d of this embodiment, the constant current source 11 included in the limiter circuit LMT is composed of PMOS transistors P31 and P32 and a current producing resistor Rbias. The sources of the transistors P31 and P32 are connected together, and the node at which they are connected together is connected to the supply power line. The gates of the transistors P31 and P32 are connected together, and the node at which they are connected together is connected to the drain of the transistor P31. The drain of the transistor P31 is connected to the line of a bias voltage, and is also grounded through the current producing resistor Rbias. The drain of the transistor P32 is connected to the drain of the transistor N33. In this embodiment, the current mirror circuit formed by the transistors P31 and P32 is given a current mirror ratio of 1:1. Needless to say, the current mirror circuit may be given any ratio other than 1:1, for example 1: b (where b is a positive integer).

When a bias voltage Vbias is applied to the constant current source I1 configured as described above, the tail current I of the differential amplifier circuit is Vbias/Rbias, and thus the differential output amplitude of the limiter circuit LMT is 2×Rout×I=2×Rout×(Vbias/Rbias). With this configuration, in which the tail current I of the differential amplifier circuit not completely fixed but varied according to variation in the current producing resistance Rbias, when the voltage-controlled oscillator 1$d$ is formed in an integrated circuit, even if the load resistance Rout of the limiter circuit LMT varies, its influence can be canceled with variation in the current producing resistance Rbias. This helps reduce variation in the output level.

In particular, by using as the current producing resistor Rbias a device of the same type as the load resistors Rout1 and Rout2 and placing the former near the latter, it is possible to make the tendency of their fabrication variations similar and thereby minimize variation in the output level.

It is advisable to use a band-gap voltage as the bias voltage Vbias applied to the constant current source I1 configured as described above. With this configuration, it is possible to maintain a constant output level not only against fabrication variations but also against variation in the supply voltage and variation in the operating temperature.

Figure 4A:
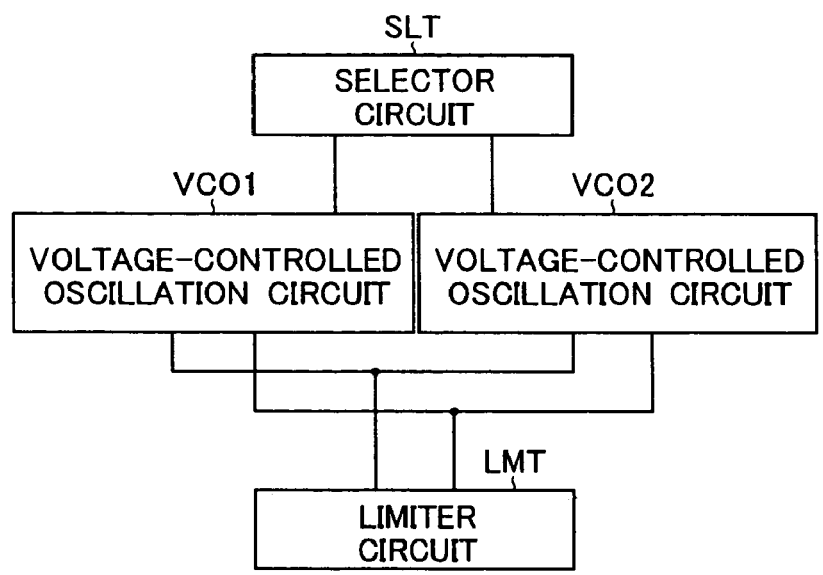
FIGS. 4A and 4B are block diagrams showing examples of the layout of the voltage-controlled oscillation circuits VCO1 and VCO2 and the limiter circuit LMT.
Figure 4B:
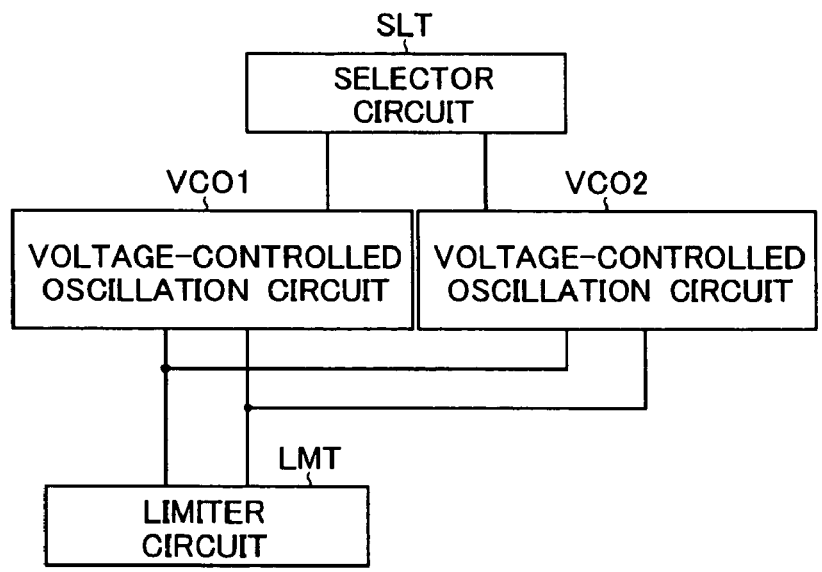

Next, the layout in which the voltage-controlled oscillation circuits VCO1 and VCO2 and the limiter circuit LMT are arranged will be described with reference to FIGS. 4A and 4B. FIGS. 4A and 4B are block diagrams showing examples of the layout of the voltage-controlled oscillation circuits VCO1 and VCO2 and the limiter circuit LMT.

In a voltage-controlled oscillator embodying the invention, it is advisable to place the limiter circuit LMT in such a way that the wiring conductors thereto from the voltage-controlled oscillation circuits VCO1 and VCO2 are equally long. In FIG. 4A, the limiter circuit LMT is placed in a position equally distant from the voltage-controlled oscillation circuits VCO1 and VCO2. With this configuration, there is no difference in the degree of attenuation caused in the outputs of the voltage-controlled oscillation circuits VCO1 and VCO2 by the wiring capacitance. This ensures that the limiter circuit LMT operates in identical manners for both the voltage-controlled oscillation circuits VCO1 and VCO2.

In a case where it is impossible to adopt the above layout, or in a case where priority is given to securing an ample margin for saturated operation of the limiter circuit LMT, it is advisable to place the limiter circuit LMT in such a way that the wiring conductors thereto from the individual voltage-controlled oscillation circuits are decreasingly long in order of decreasing output levels therefrom. In FIG. 4B, the limiter circuit LMT is placed near the voltage-controlled oscillation circuit that yields the lower output (specifically, here, the voltage-controlled oscillation circuit VCO1). With this configuration, it is possible to make the degree of attenuation caused in the outputs of the voltage-controlled oscillation circuits by the wiring capacitance decreasingly high in order of decreasing output levels therefrom. This makes it easier to maintain the predetermined input level required for the limiter circuit LMT to operate in a saturated state, and makes it possible to secure an ample margin for saturated operation of the limiter circuit LMT.

Figure 5A:
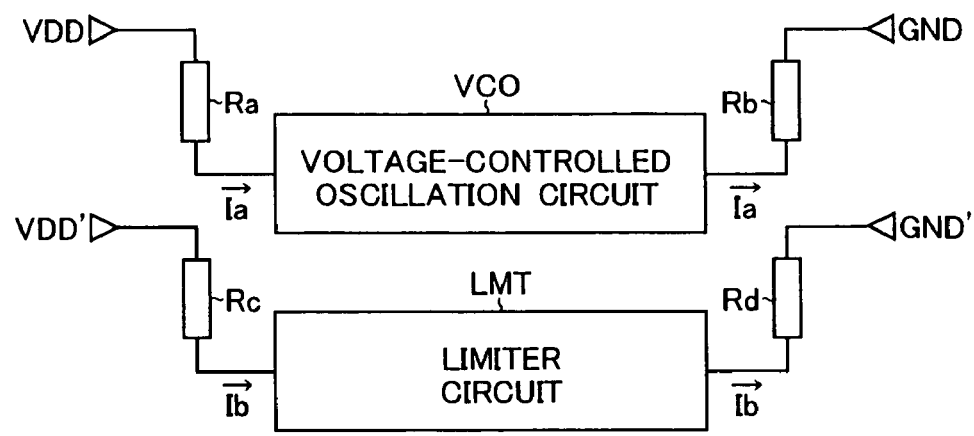
FIGS. 5A and 5B are block diagrams showing examples of the layout of the supply power lines to the voltage-controlled oscillation circuits and the limiter circuit.
Figure 5B:
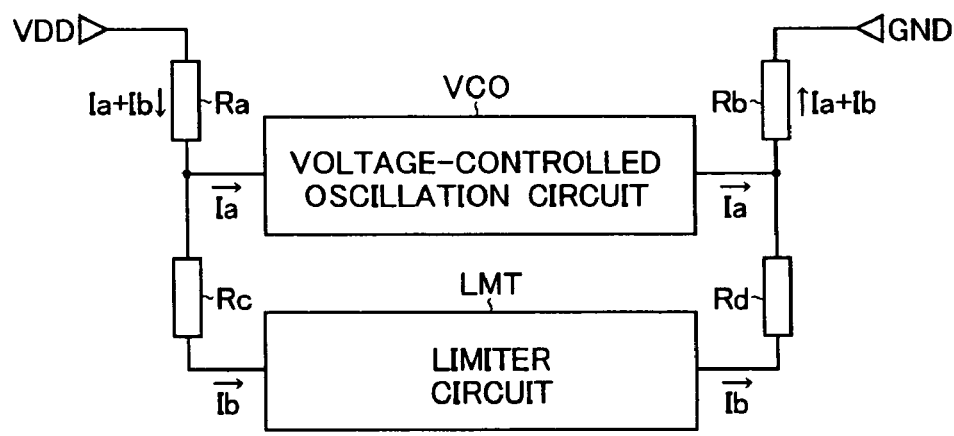

Next, the layout of the supply power lines to the voltage-controlled oscillation circuit and the limiter circuit LMT will be described with reference to FIGS. 5A and 5B. FIGS. 5A and 5B are block diagrams showing examples of the layout of the supply power lines to the voltage-controlled oscillation circuit and the limiter circuit LMT. FIG. 5A shows the circuit configuration of a voltage-controlled oscillator embodying the invention, where the supply power line to the voltage-controlled oscillation circuit VCO and the supply power line to the limiter circuit LMT are separated from each other. By contrast, FIG. 5B shows, for comparison, a circuit configuration where the same supply power lines are shared between the voltage-controlled oscillation circuit VCO and the limiter circuit LMT. In FIGS. 5A and 5B, the wiring resistances of the supply power lines are represented by Ra to Rd.

As described above, in a voltage-controlled oscillator embodying the invention, the supply power line to the voltage-controlled oscillation circuit VCO and the supply power line to the limiter circuit LMT are separated from each other. By eliminating common loads on the supply power lines which are shared between the voltage-controlled oscillation circuit VCO and the limiter circuit LMT in this way, it is possible to prevent one circuit from affecting the other. Specifically, whereas, in the circuit configuration shown in FIG. 5B, a voltage drop of (Ra+Rb)×(Ia+Ib) occurs in the voltage-controlled oscillation circuit VCO, in the circuit configuration shown in FIG. 5A, the voltage drop is (Ra+Rb)×Ia, achieving a reduction of (Ra+Rb)×Ib in the voltage drop. Thus, with this configuration, it is possible to avoid deterioration of the phase noise characteristics of the voltage-controlled oscillation circuit VCO resulting from the additional provision of the limiter circuit LMT.

Figure 6:
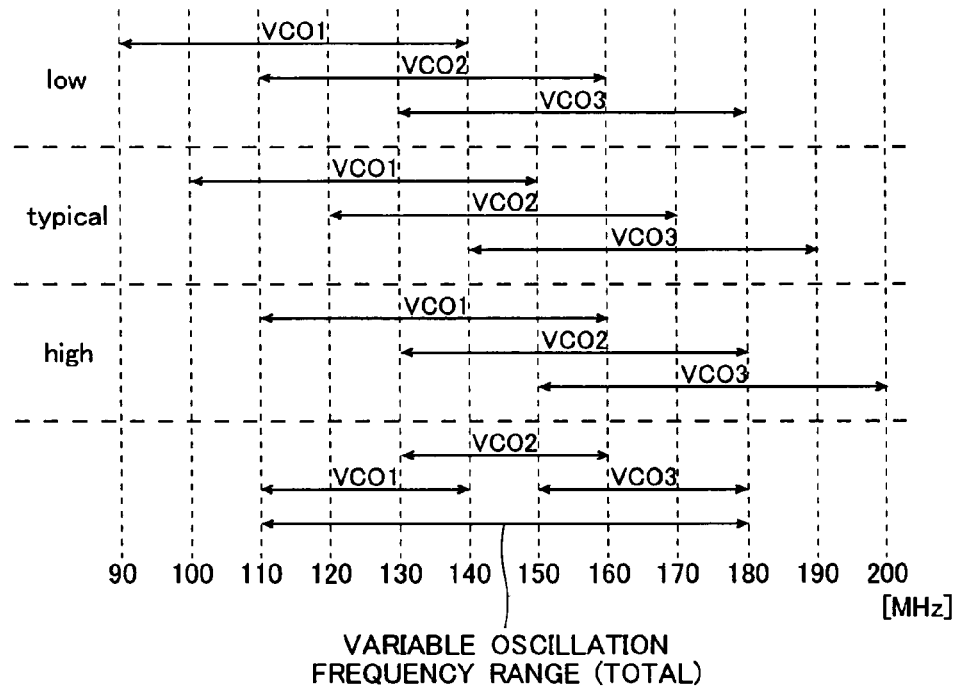
FIG. 6 is a diagram showing the variable oscillation frequency range of a voltage-controlled oscillator embodying the invention.
Figure 7:
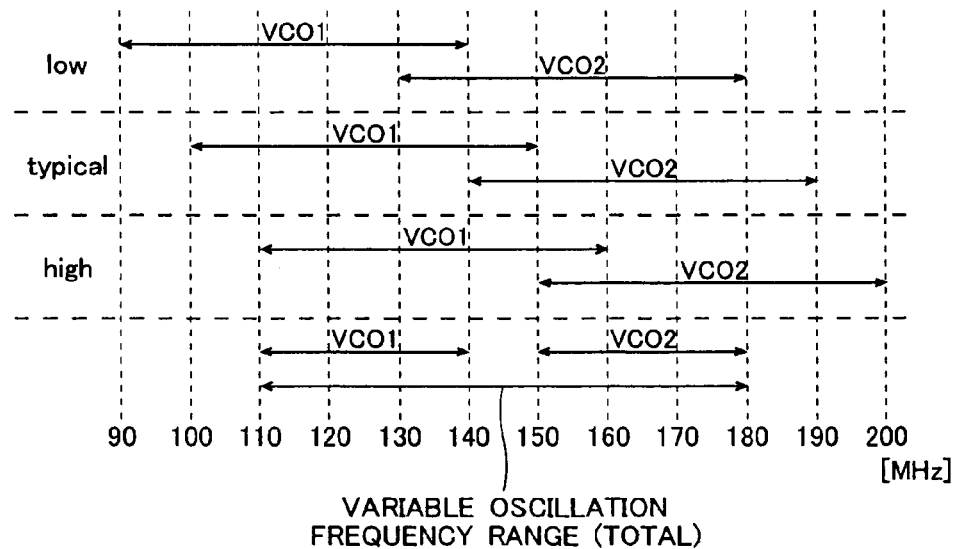
FIG. 7 is a diagram showing the variable oscillation frequency range of a conventional voltage-controlled oscillator.

Next, the variable oscillation frequency ranges of the individual voltage-controlled oscillation circuits will be described with reference to FIG. 6. FIG. 6 is a diagram showing the variable oscillation frequency range of a voltage-controlled oscillator embodying the invention. In the voltage-controlled oscillator shown in this figure, the variable oscillation frequency ranges of its constituent voltage-controlled oscillation circuits VCO1 to VCO3 are, when most deviated on the low side (in a low state), from 90 MHz to 140 MHz, from 110 MHz to 160 MHz, and from 130 MHz to 180 MHz, respectively, and, when most deviated on the high side (in a high state), from 110 MHz to 160 MHz, from 130 MHz to 180 MHz, and from 150 MHz to 200 MHz, respectively. In this way, in this voltage-controlled oscillator embodying the invention, not only are the variable oscillation frequency ranges of the individual voltage-controlled oscillation circuits VCO1 to VCO3 so set as to overlap at their ends at any state as conventionally practiced, but also those portions of the variable oscillation frequency ranges of the individual voltage-controlled oscillation circuits VCO1 to VCO3 which are free from variations (specifically, from 110 MHz to 140 MHz, from 130 MHz to 160 MHz, and from 150 MHz to 180 MHz, respectively) are so set as to overlap at their ends. That is, in this voltage-controlled oscillator embodying the invention, the variable oscillation frequency ranges of the individual voltage-controlled oscillation circuits are so adjusted that the upper end frequency of the nth (where n≧1) voltage-controlled oscillation circuit as observed in the low state is higher than the lower end frequency of the mth (where m=n+1) voltage-controlled oscillation circuit as observed in the high state.

With the voltage-controlled oscillator configured as described above, in any state, not only is it possible to vary the oscillation frequency over the range from 110 MHz to 180 MHz, but it is also possible to uniquely decide which voltage-controlled oscillation circuit to select for oscillation at a given frequency. This eliminates the need for a circuit for checking whether or not each of the voltage-controlled oscillation circuits VCO1 to VCO3 can oscillate at a desired frequency and a circuit for choosing, when any of them is found to be unable to oscillate at that frequency, another.

This helps reduce the circuit scale of and the power consumption by the voltage-controlled oscillator.

As described above, with a voltage-controlled oscillator according to the present invention and with an integrated circuit device provided with such a voltage-controlled oscillator, it is possible to maintain a constant output level all the time irrespective of the oscillation frequency. Moreover, with a voltage-controlled oscillator according to the present invention and with an integrated circuit device provided with such a voltage-controlled oscillator, it is possible to uniquely decide which voltage-controlled oscillation circuit to select for oscillation at a given frequency.

What is claimed is:

1. A voltage-controlled oscillator comprising:
a voltage-controlled oscillation circuit that oscillates at a frequency according to a control voltage; and
a limiter circuit that, if an output of the voltage-controlled oscillator is higher than a predetermined level, limits the output of the voltage-controlled oscillator to the predetermined level,
wherein, even when, according to the control voltage, the output of the voltage-controlled oscillator varies along with the frequency at which the voltage-controlled oscillator is oscillating, if the output of the voltage-controlled oscillator is higher than the predetermined level, an output of the limiter circuit is kept at a constant level,
wherein the limiter circuit includes a differential amplifier circuit that receives the output of the voltage-controlled oscillation circuit and operates in a saturated state,
wherein the differential amplifier circuit operates from an operation current produced by a constant current source that produces a constant current by applying a predetermined voltage to a current producing resistor.

2. The voltage-controlled oscillator according to claim 1, wherein the current producing resistor is a device of a same type as a load resistor of the differential amplifier, and is placed near the load resistor.

3. The voltage-controlled oscillator according to claim 1, wherein the predetermined voltage is produced by a band-gap circuit.

4. The voltage-controlled oscillator according to claim 1, wherein a supply power line to the voltage-controlled oscillation circuit and a supply power line to the limiter circuit are separate from each other.

5. A voltage-controlled oscillator comprising:
a plurality of voltage-controlled oscillation circuits that oscillate at a frequency according to a control voltage;
a selector circuit that selects one of the voltage-controlled oscillation circuits and makes the selected voltage-controlled oscillation circuit operate; and
a limiter circuit that, if an output of the selected voltage-controlled oscillation circuit is higher than a predetermined level, limits the output of the selected voltage-controlled oscillation circuit to the predetermined level,
wherein, even when outputs of the plurality of voltage-controlled oscillation circuits have different levels, if the output of the selected voltage-controlled oscillator is higher than the predetermined level, an output of the limiter circuit is kept at a constant level.

6. The voltage-controlled oscillator according to claim 5, wherein the limiter circuit includes a differential amplifier circuit that receives the output of the voltage-controlled oscillation circuit and operates in a saturated state.

7. The voltage-controlled oscillator according to claim 6, wherein the differential amplifier circuit operates from an operation current produced by a constant current source that produces a constant current by applying a predetermined voltage to a current producing resistor.

8. The voltage-controlled oscillator according to claim 7, wherein the current producing resistor is a device of a same type as a load resistor of the differential amplifier, and is placed near the load resistor.

9. The voltage-controlled oscillator according to claim 7, wherein the predetermined voltage is produced by a band-gap circuit.

10. The voltage-controlled oscillator according to claim 5, wherein the limiter circuit is so placed that wiring conductors thereto from the individual voltage-controlled oscillation circuits are equally long.

11. The voltage-controlled oscillator according to claim 5, wherein the limiter circuit is so placed that wiring conductors thereto from the individual voltage-controlled oscillation circuits are decreasingly long in order of decreasing output levels from the voltage-controlled oscillation circuits.

12. The voltage-controlled oscillator according to claim 5, wherein a supply power line to the voltage-controlled oscillation circuits and a supply power line to the limiter circuit are separate from each other.

13. A voltage-controlled oscillator comprising:
a plurality of voltage-controlled oscillation circuits that oscillate at a frequency according to a control voltage; and
a selector circuit that selects one of the voltage-controlled oscillation circuits and makes the selected voltage-controlled oscillation circuit operate,
wherein variable oscillation frequency ranges of adjacent voltage-controlled oscillation circuits are so set as to overlap at ends thereof, and variable oscillation frequency ranges of the individual voltage-controlled oscillation circuits are so adjusted that an upper end frequency of an nth (where $n \geq 1$) voltage-controlled oscillation circuit as observed when most deviated on a low side is higher than a lower end frequency of mth (where $m=n+1$) voltage-controlled oscillation circuit as observed when most deviated on a high side.

14. An integrated circuit device comprising:
a voltage-controlled oscillator including a voltage-controlled oscillation circuit that oscillates at a frequency according to a control voltage and a limiter circuit that, if an output of the voltage-controlled oscillator is higher than a predetermined level, limits the output of the voltage-controlled oscillator to the predetermined level,
wherein, even when, according to the control voltage, the output of the voltage-controlled oscillator varies along with the frequency at which the voltage-controlled oscillator is oscillating, if the output of the voltage-controlled oscillator is higher than the predetermined level, an output of the limiter circuit is kept at a constant level,
wherein the limiter circuit includes a differential amplifier circuit that receives the output of the voltage-controlled oscillation circuit and operates in a saturated state,
wherein the differential amplifier circuit operates from an operation current produced by a constant current source that produces a constant current by applying a predetermined voltage to a current producing resistor.

15. An integrated circuit device comprising:
a voltage-controlled oscillator including a plurality of voltage-controlled oscillation circuits that oscillate at a frequency according to a control voltage, a selector circuit that selects one of the voltage-controlled oscillation circuits and makes the selected voltage-controlled oscillation circuit operate, and a limiter circuit that, if an output of the selected voltage-controlled oscillator is higher than a predetermined level, limits the output of the selected voltage-controlled oscillation circuit to the predetermined level, wherein, even when outputs of the plurality of voltage-controlled oscillation circuits have different levels, if the output of the selected voltage-controlled oscillator is higher than the predetermined level, an output of the limiter circuit is kept at a constant level.

16. An integrated circuit device comprising:

a voltage-controlled oscillator comprising a plurality of voltage-controlled oscillation circuits that oscillate at a frequency according to a control voltage and a selector circuit that selects one of the voltage-controlled oscillation circuits and makes the selected voltage-controlled oscillation circuit operate, wherein variable oscillation frequency ranges of adjacent voltage-controlled oscillation circuits are so set as to overlap at ends thereof, and variable oscillation frequency ranges of the individual voltage-controlled oscillation circuits are so adjusted that an upper end frequency of an nth (where $n \geqq 1$) voltage-controlled oscillation circuit as observed when most deviated on a low side is higher than a lower end frequency of an mth (where $m=n+1$) voltage-controlled oscillation circuit as observed when most deviated on a high side.

* * * * *